(12) United States Patent
Miller

(10) Patent No.: US 6,762,599 B1
(45) Date of Patent: Jul. 13, 2004

(54) SEMICONDUCTOR INTEGRATED CIRCUIT TESTER

(75) Inventor: Wayne H. Miller, Los Altos, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/234,497

(22) Filed: Sep. 3, 2002

(51) Int. Cl.[7] .............................................. G01R 31/00
(52) U.S. Cl. .................................................... 324/158.1
(58) Field of Search ............................ 324/73.1, 158.1, 324/754, 755, 765; 438/14, 17–18; 439/66–72

(56) References Cited

U.S. PATENT DOCUMENTS

| | | | | |
|---|---|---|---|---|
| 4,758,780 A | * | 7/1988 | Coon et al. | 324/73.1 |
| 5,656,942 A | * | 8/1997 | Watts et al. | 324/754 |
| 5,828,223 A | * | 10/1998 | Rabkin et al. | 324/754 |

* cited by examiner

*Primary Examiner*—Vinh P. Nguyen
(74) *Attorney, Agent, or Firm*—John Smith-Hill; Smith-Hill and Bedell

(57) ABSTRACT

A semiconductor integrated circuit tester includes a housing having a tester interface area, a guide structure in the housing and defining an engagement axis that intersects the tester interface area, and a circuit board structure fitted in the guide structure in a manner allowing movement of the circuit board structure relative to the housing along the engagement axis. The circuit board structure has a tester interface that is exposed exteriorly of the housing at the tester interface area. An attachment mechanism releasably engages a test board having a test board interface and secures the test board against movement along the engagement axis in a direction away from the tester interface area. When the test board is secured to the housing by the attachment mechanism and the tester interface is not engaged with the test board interface, the circuit board structure may be urged to move along the engagement axis to force the tester interface into engagement with the test board interface.

9 Claims, 5 Drawing Sheets

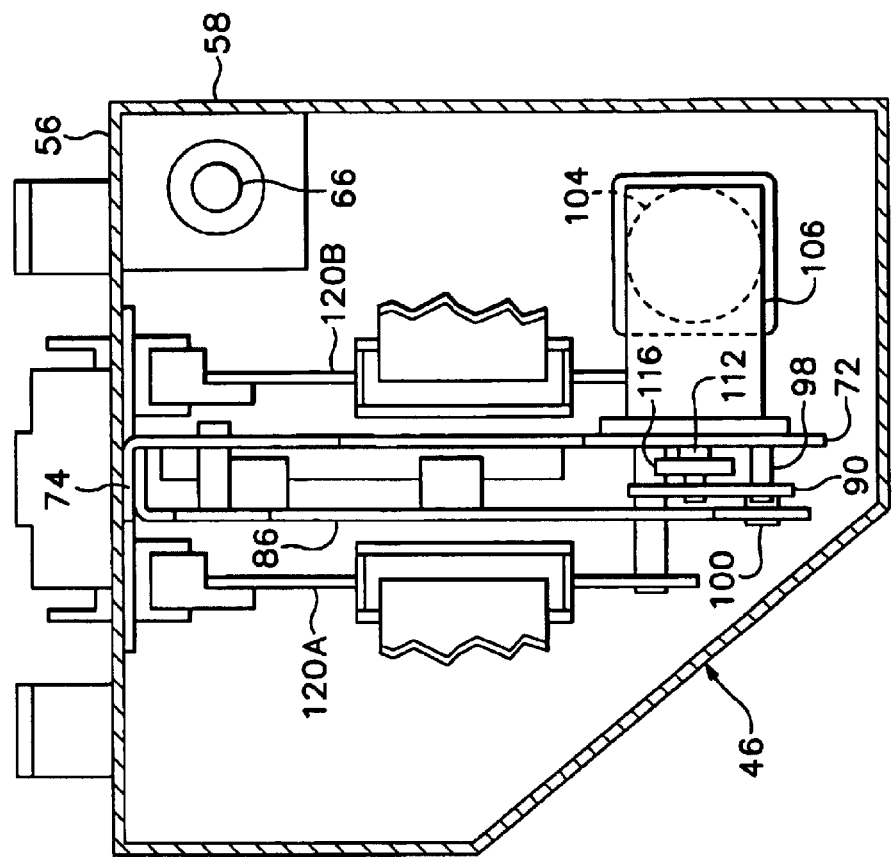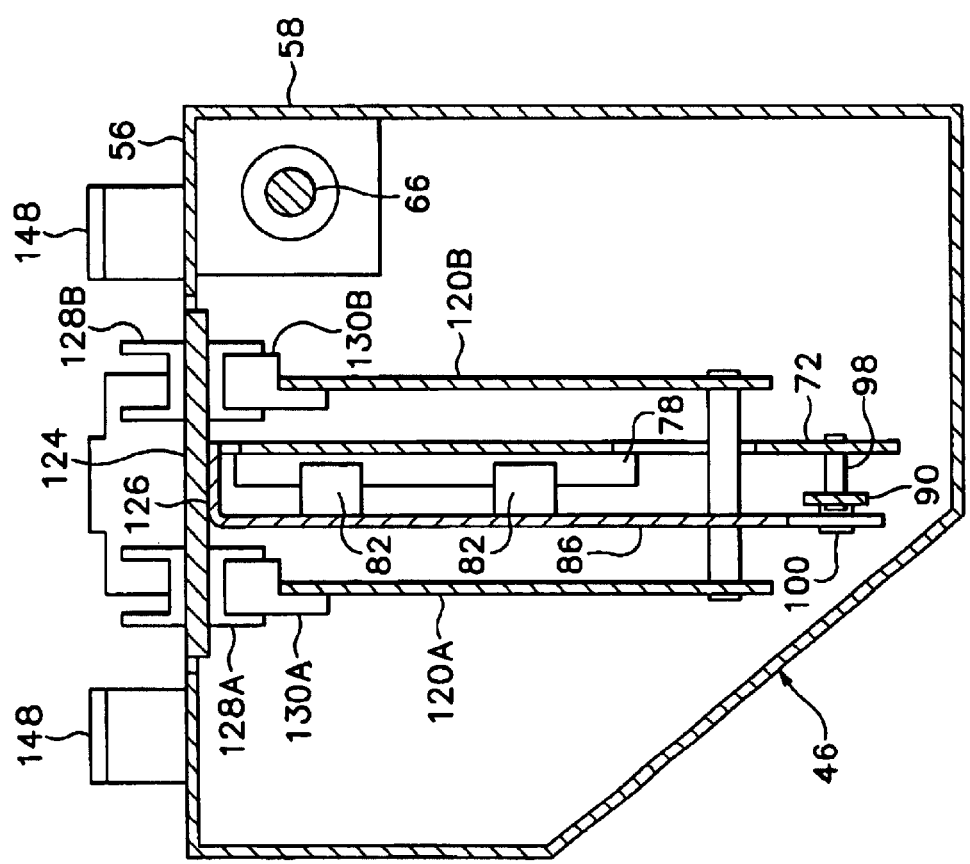

SEMICONDUCTOR INTEGRATED CIRCUIT TESTER

CROSS-REFERENCE TO RELATED APPLICATION

Subject matter disclosed in this application may be deemed to be related to subject matter disclosed in co-pending patent application Ser. No. 10/234,496 filed Sep. 3, 2002.

BACKGROUND OF THE INVENTION

This invention relates to semiconductor integrated circuit testers, and particularly to a personal tester for laboratory use.

The semiconductor integrated circuit tester that is sold by Credence Systems Corporation under the designation Personal Kalos is designed for personal use by a technician or engineer in a laboratory rather than for production use in a manufacturing facility. The Personal Kalos tester includes pin electronics implemented on a main circuit board mounted in a generally parallelepipedal housing. The main circuit board has a tester interface that is exposed at one main face of the housing and includes several tester interface pin headers. A load board, which serves as a spatial transformer between the tester interface pin headers and a DUT socket for receiving a device under test (DUT), has receptacles that engage the tester interface pin headers.

The Personal Kalos tester may be positioned on or adjacent to the user's work bench, and when the user wishes to test a device of a particular type he selects the appropriate load board, engages the receptacles of the load board with the tester interface pin headers of the Personal Kalos tester, and installs the DUT in the DUT socket of the load board. When the user wishes to test a device of a different type, it will generally be necessary for him to remove the current load board and engage the load board for the new type of device with the tester interface.

When the user removes a load board from engagement with the tester interface or engages a new load board with the tester interface, he may inadvertently tilt the load board. Tilting of the load board may result in the pins of the load board receptacles or the pins of the tester interface pin headers being bent or otherwise damaged.

It has been found that it is generally more convenient for the user of the Personal Kalos tester to engage a load board with the tester interface by downward vertical movement of the load board relative to the tester housing. It is easier to maintain the orientation of the load board relative to the tester interface, and avoid tilting of the load board, during downward vertical movement of the load board than during movement along a non-vertical, e.g. horizontal axis. The dimensions of the tester housing of the Personal Kalos tester are such that it is easy to position the tester interface in a horizontal orientation when the tester is placed beside the user's work bench, but if the tester is placed on the user's work bench it can be awkward to position the tester interface in a horizontal orientation.

SUMMARY OF THE INVENTION

In accordance with a first aspect of the invention there is provided a semiconductor integrated circuit tester including a housing having a tester interface area, a guide structure in the housing and defining an engagement axis that intersects the tester interface area, a circuit board structure fitted in the guide structure in a manner allowing movement of the circuit board structure relative to the housing along the engagement axis, the circuit board structure having a tester interface that is exposed exteriorly of the housing at the tester interface area, a drive means for urging the circuit board structure to move relative to the housing along the engagement axis, and an attachment mechanism for releasably engaging a test board having a test board interface and securing the test board against movement along the engagement axis in a direction away from the tester interface area, whereby, when the test board is secured to the housing by the attachment mechanism and the tester interface is not engaged with the test board interface, the drive means may be operated to urge the circuit board structure to move along the engagement axis in said direction to force the tester interface into engagement with the test board interface.

In accordance with a second aspect of the invention there is provided a semiconductor integrated circuit tester including a housing having a tester interface area, a guide structure in the housing and defining an engagement axis that intersects the tester interface area, a circuit board structure fitted in the guide structure in a manner allowing movement of the circuit board structure relative to the housing along the engagement axis, the circuit board structure having a tester interface that is exposed exteriorly of the housing at the tester interface area, a drive means for urging the circuit board structure to move relative to the housing along the engagement axis, a test board having a test board interface for engaging the tester interface, and an attachment mechanism for releasably engaging the test board and securing the test board against movement along the engagement axis in a direction away from the tester interface area, the attachment mechanism including first and second complementary attachment elements secured to the tester housing and the test board respectively, whereby, when the test board is secured to the housing by the attachment mechanism and the tester interface is not engaged with the test board interface, the drive means may be operated to urge the circuit board structure to move along the engagement axis in said direction to force the tester interface into engagement with the test board interface.

BRIEF DESCRIPTION OF THE DRAWINGS

For a better understanding of the invention, and to show how the same may be carried into effect, reference will now be made, by way of example, to the accompanying drawings, in which FIG. 4 is a sectional view taken on the line 4—4 of FIG. 2, FIG. 5 is a sectional view taken on the line 5—5 of FIG. 2.

Figure 1:
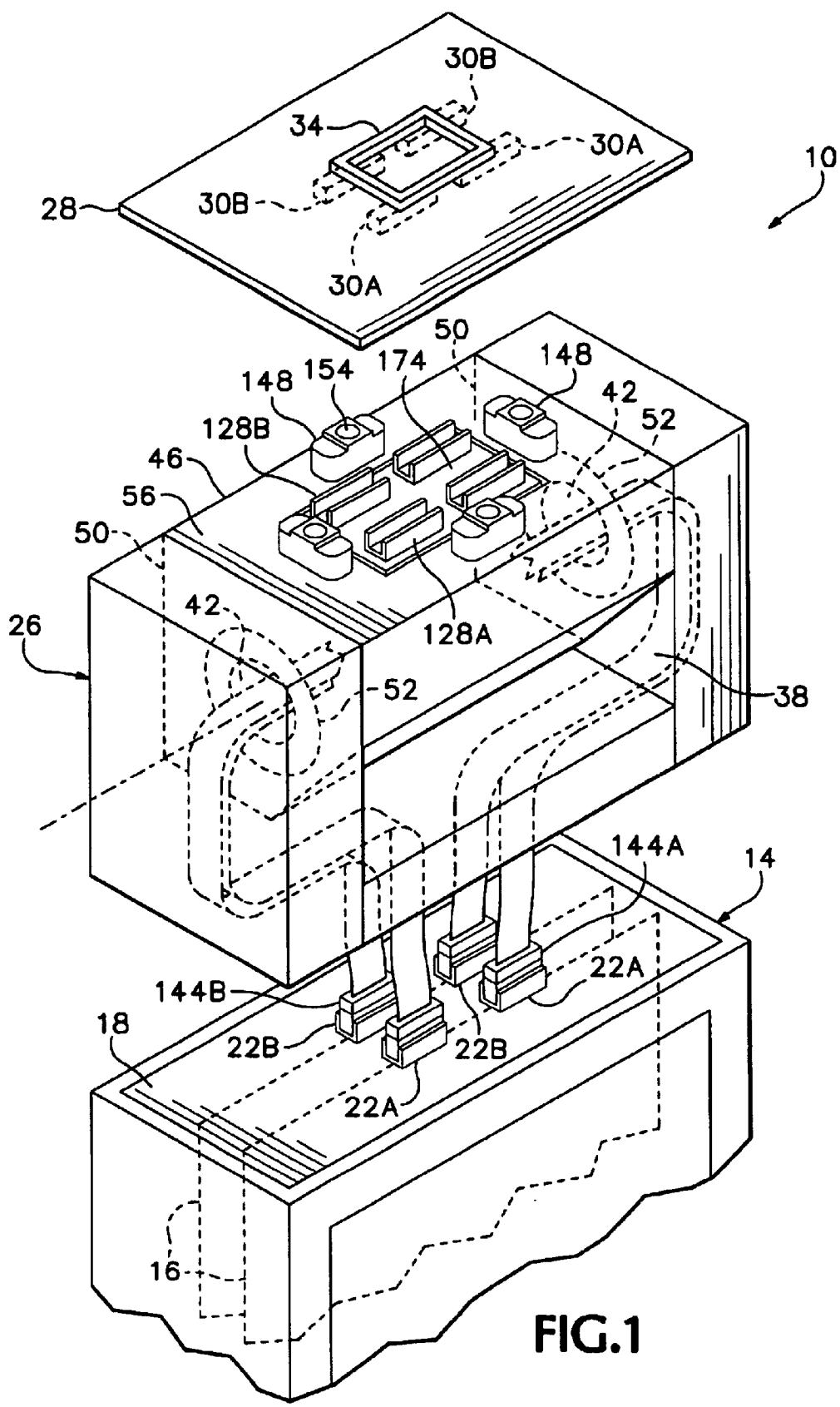
FIG. 1 is a partial perspective exploded view of a first semiconductor integrated circuit tester embodying the present invention in a first operational configuration.

In this specification, words of orientation and position, such as upper and lower, above and below, are used to establish orientation and position relative to the views shown in the drawings and are not used in an absolute sense.

DETAILED DESCRIPTION

The semiconductor integrated circuit tester shown in FIGS. 1–6 is designed for testing flash memory devices. The tester 10 comprises a main housing 14 containing two tester main boards 16 that are disposed parallel to each other and perpendicular to a tester interface wall 18 of the main housing. The pin electronics of the tester, including tester circuits (not shown) such as drivers and comparators, for supplying and receiving test signals, are implemented on the main boards. Two pairs of shrouded pin headers 22A, 22B (the pins are not shown) are attached to the main boards 16 respectively and project from the housing 10 at the tester interface wall 18.

The pin headers 22, which include ground pins, power supply pins and signal pins, form a main tester interface. The signal pins are connected to the tester circuits of the pin electronics of the respective main boards. The tester circuits are close to the signal pins in order to minimize capacitive loading of the signal pins.

The tester 10 also comprises an auxiliary housing 26 that can be attached to the main housing 14 so that the base of the auxiliary housing engages the tester interface wall 18. FIG. 1 also illustrates a test board 28 having tester interface receptacles 30 at its lower side. In the embodiment described with reference to FIGS. 1–6, the test board is a load board having a DUT socket 34 at its upper side. The pattern of the receptacles 30 corresponds to the pattern of the pin headers 22. Accordingly, if the auxiliary housing 26 were removed from the main housing 14, the user could engage the load board receptacles 30 with the pin headers 22 by first aligning the load board receptacles 30 with the pin headers 22 and then forcing the load board downwards so that the receptacles 30 engage the pin headers 22. In this manner, electrical connections would be established between the pin electronics and the pins of the DUT socket 34.

The auxiliary housing 26 includes two parallel bulkheads 38 that are perpendicular to the tester interface wall 18 and each of which is formed with a circular opening 42. The centers of the two circular openings 42 lie on an axis that is perpendicular to the bulkheads 38.

A buffer unit 46 that is mounted in the auxiliary housing 26 has two parallel end walls 50 and a rotary bearing sleeve 52 (FIG. 2) is attached to each end wall 50. The rotary bearing sleeves 52 are journalled in the openings 42 respectively, allowing the buffer unit 46 to rotate relative to the bulkheads 38.

Figure 2:
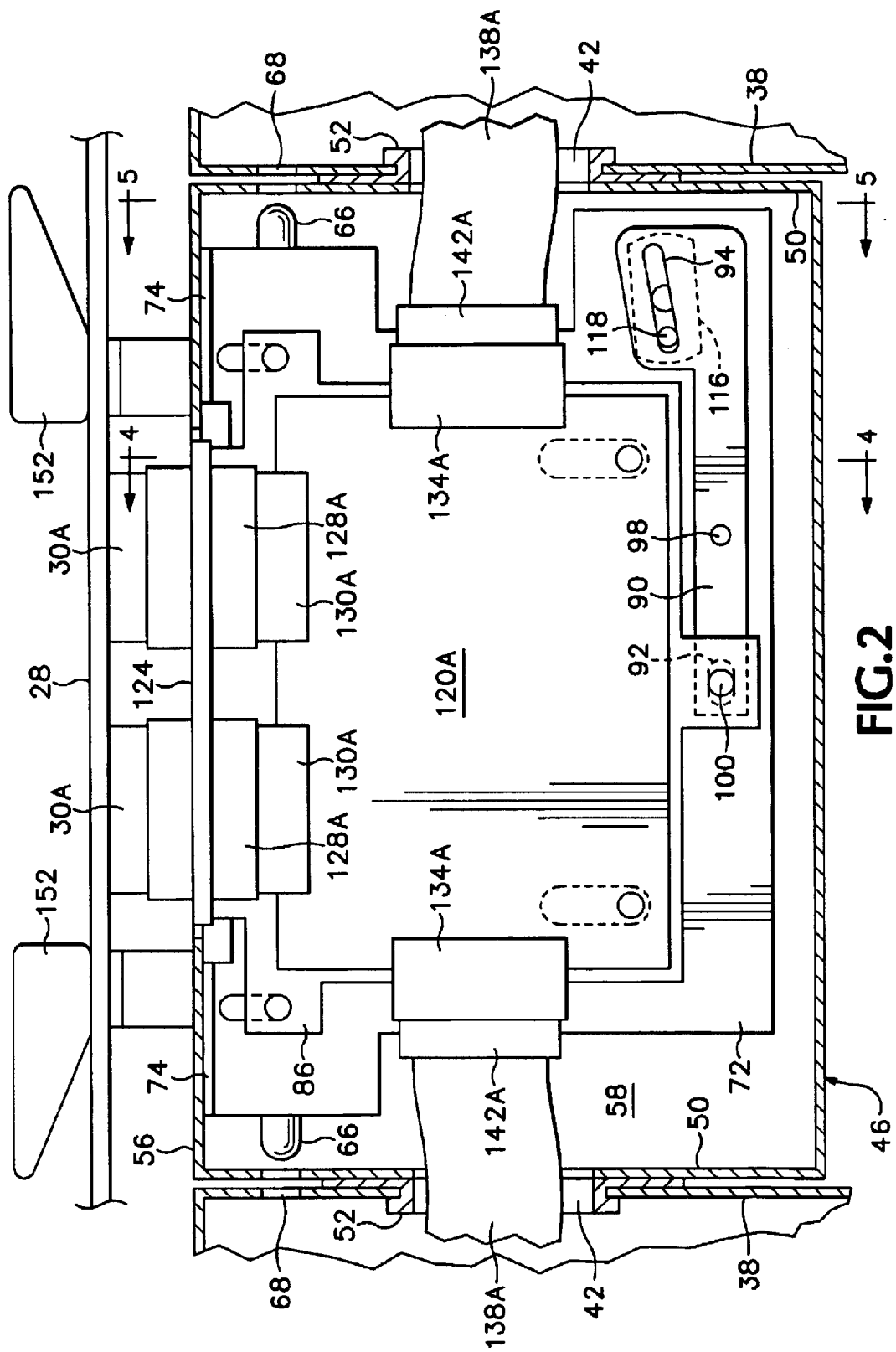
FIG. 2 is a partial enlarged sectional view of an auxiliary housing including a carrier plate, with the carrier plate being shown in its lower position.
Figure 3:
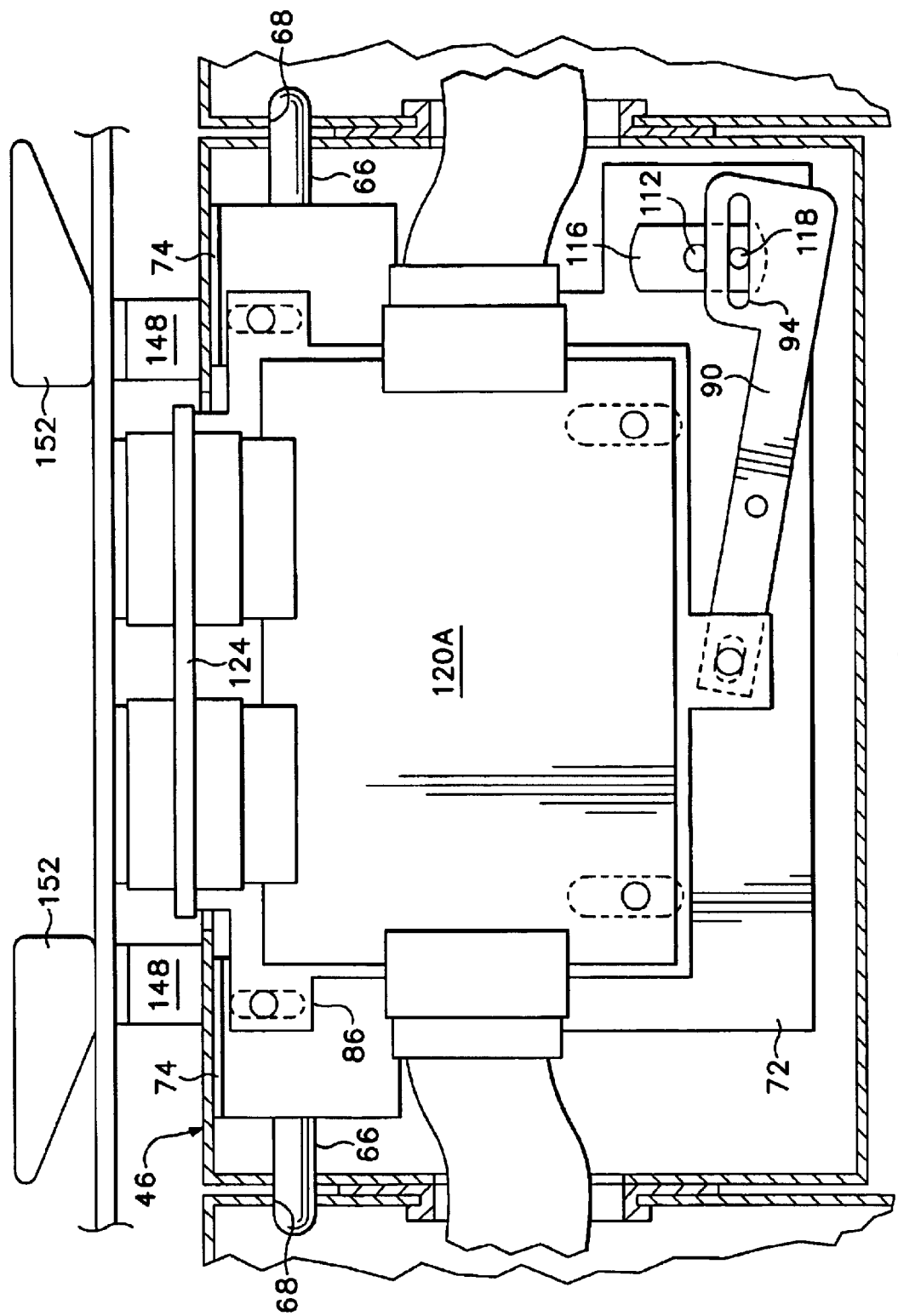
FIG. 3 is a view similar to FIG. 2 showing the carrier plate in its upper position.
Figure 6:
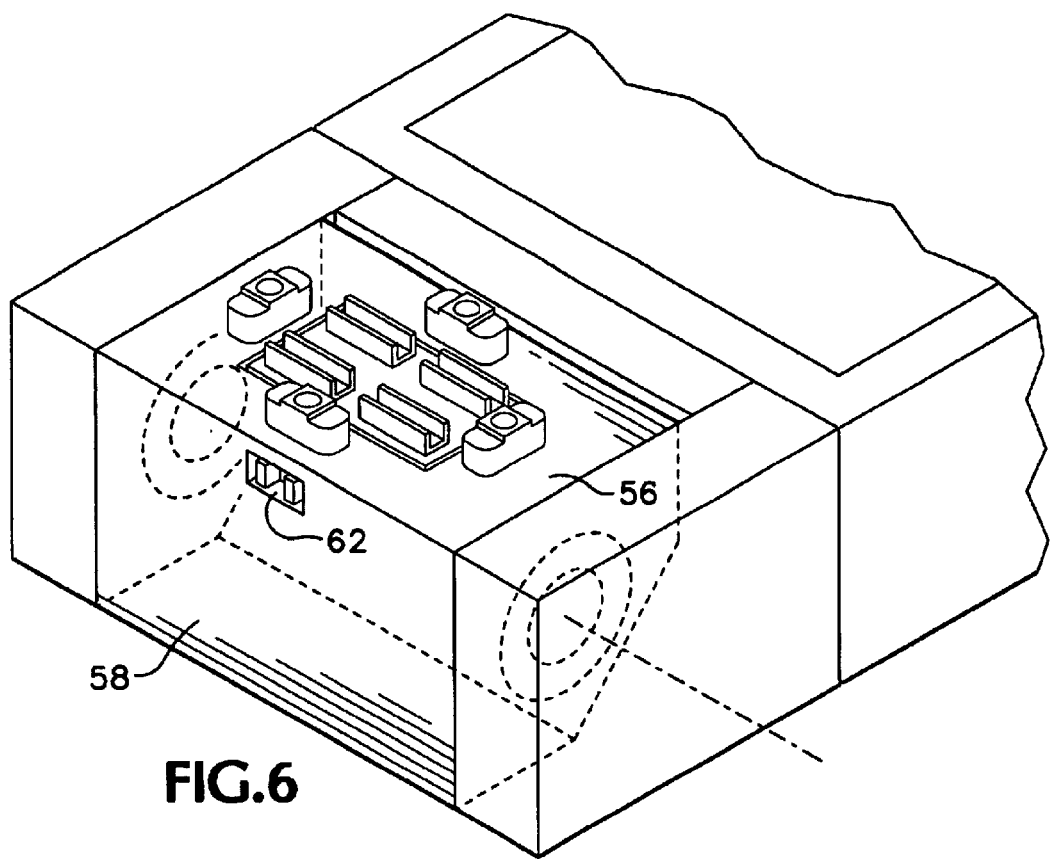
FIG. 6 is a partial perspective view of the FIG. 1 tester in a second operational configuration.

The buffer unit 46 has two longitudinal walls 56, 58 extending perpendicular to each other and to the end walls 50. Referring to FIGS. 2, 3 and 6, a squeeze latch mounted to the wall 58 includes two bolts 66 that project through the end walls 50 and an operating mechanism 62 that is accessible at the exterior of the wall 58. In a first angular position of the buffer unit 46, in which the wall 56 is parallel to the tester interface wall 18, the latch bolts engage sockets 68 in the bulkheads 28. See FIG. 3. By squeezing the operating mechanism 62 the bolts can be withdrawn from the sockets 68 (FIG. 2), allowing the buffer unit to rotate relative to the bulkheads 38 to a second angular position (FIG. 6), in which the wall 56 is perpendicular to the tester interface wall 18. On releasing the operating mechanism in the second angular position, the latch bolts engage additional sockets in the bulkheads 38.

Referring to FIGS. 2–5, the buffer unit 46 includes a slide bracket 72 that is attached to the wall 56 of the buffer unit by flanges 74 and is generally perpendicular to the wall 56. A linear bearing rail 78 is attached to the slide bracket 72 and is provided with slide bearing blocks 82 that are movable linearly along the bearing rail. A carrier plate 86 is attached to the slide bearing blocks 82 and is therefore movable relative to the wall 56 along an engagement axis that is defined by the linear bearing rail and is perpendicular to the wall 56. Conventional mechanical elements (not shown) are used to hold the carrier plate 86 parallel to the slide bracket 72 and to maintain the orientation of the carrier plate 86 relative to the slide bracket when the carrier plate moves along the engagement axis.

A lever 90 having slots 92, 94 at its two opposite ends is attached intermediate its ends to the slide bracket 72 by a screw 98 that allows the lever to pivot relative to the slide bracket about an axis perpendicular to the slide bracket. A pin 100 is attached to the carrier plate and extends through the slot 92 in the lever 90. Accordingly, pivotal movement of the lever 90 is accompanied by linear movement of the carrier plate 86 relative to the slide bracket 72 along the engagement axis.

A motor 104 is attached to the slide bracket 72 by a motor mount bracket 106. The motor 104 has a drive shaft that is connected through a right-angle gear to a shaft 112 extending perpendicular to the slide bracket 72. The shaft 112 carries a cam plate 116 from which a dowel pin 118 projects into the slot 94 of the lever 90. When the motor 104 operates to rotate the cam plate 116 in the counterclockwise direction from the position shown in FIG. 2, the lever 90 rotates clockwise as seen in FIGS. 2 and 3 and raises the carrier plate 86 relative to the slide bracket 72 to the position shown in FIG. 3; and when the motor operates to rotate the cam plate in the clockwise direction, the lever 90 rotates counterclockwise and lowers the carrier plate back to the position shown in FIG. 2.

Limit switches (not shown) are attached to the slide bracket 72 for detecting when the carrier plate 86 reaches the lower and upper extreme positions (FIGS. 2 and 3 respectively) and preventing further rotation of the cam plate in the same direction.

A first interface buffer board 120A is attached directly to the carrier plate 86 and a second interface buffer board 120B is attached to the carrier plate 86 by screws that extend through slots in the slide bracket 72. Accordingly, the slide bracket 72 is located between the carrier plate 86 and the buffer board 120B.

A carrier board 124 is attached to the carrier plate 86 by screws (not shown) that engage a flange 126 at the upper edge of the carrier plate. The carrier board 124 is oriented perpendicular to the buffer boards 120 and carries two pairs of male-male feed-through pin headers 128A and 128B.

Each of the boards 120 is provided with two receptacles 130 at its upper edge. The receptacles 130 engage the lower (tester side) pin headers 128 respectively. Each of the boards 120 is also provided with a pin header 134 at each of its vertical edges. Four cables 138 are each provided at one end with a receptacle 142 for engaging one of the pin headers 134 and at the other end with a receptacle 144 for engaging one of the pin headers 22 at the tester interface wall 18.

Each DUT side pin header 128 is essentially identical to a corresponding pin header 22 of the main tester interface and the DUT side pin headers 128 collectively form an auxiliary tester interface. Each pin of each feed-through pin header 128 is connected through the buffer circuit board and the cable 138 to the pin of the receptacle 144 that engages the corresponding pin of the pin header 22. Accordingly, the buffer boards 120 and the cables 138 connect each pin of the main tester interface with a corresponding pin of the auxiliary tester interface.

The layout of the pin headers 128 at the wall 56 of the buffer unit corresponds to the layout of the pin headers 22 at the tester interface wall 18. Accordingly, the receptacles 30 of the test board are engageable with the pin headers 128.

The buffer boards 120 implement buffer circuits (not shown) that isolate the pins of the connectors 128 capacitively from the cables 138 and thereby ensure that the capacitance of the cables 138 does not load the pins of the connectors 128 to an excessive degree.

Four frame brackets 148 are attached to the wall 56 of the buffer unit. The load board 28 has latches 152 (not shown in FIG. 1) including downward-extending locking pins (not shown) for engaging bores 154 in the frame brackets 148 and securing the load board to the frame brackets when the latches are actuated. The frame brackets 148 and latches 152 are positioned so that there is only a single position of the load board relative to the carrier board 124 in which the locking pins will engage the respective bores in the frame brackets. When the carrier plate is in its lower position (FIG. 2), the user attaches the load board to the buffer unit by engaging the locking pins with the frame brackets and actuating the latches to secure the load board to the frame brackets and hence to the buffer unit. The operator then actuates the motor 104, which drives the carrier plate 86 upwards. As the carrier plate moves upwards, the pin headers 128 engage the receptacles 30 of the load board. The user may then install a device in the DUT socket 34 for testing. Should the user wish to test a different type of device, he removes the current load board by actuating the motor to drive the carrier plate downwards and disengage the pin headers 128 from the receptacles of the load board, releasing the latches, and disengaging the locking pins of the latches 152 from the bores 154 of the frame brackets 148. The user can then install the load board appropriate to the next type of device to be tested.

By engaging and disengaging the pin headers 128 with the load board receptacles 30 by driving the carrier plate up and down while the load board is connected to the frame brackets, the load board is held perpendicular to the engagement axis during insertion and extraction and so the risk of the load board tilting relative to the engagement axis, resulting in bending of pins of the pin header or receptacle, is avoided.

Figure 7:
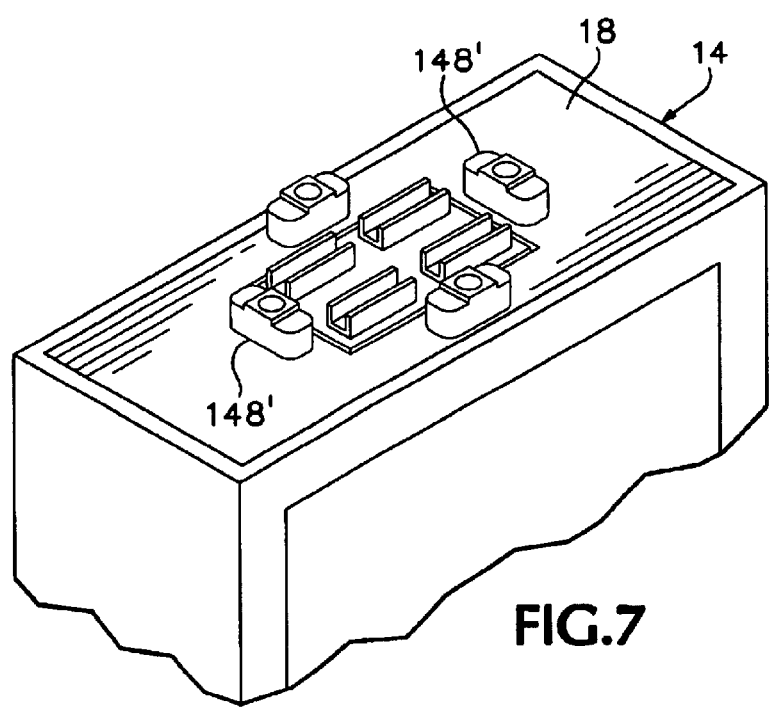
FIG. 7 is a partial perspective view of a second semiconductor integrated circuit tester embodying the present invention.

The shape and size of the main housing 14 are such that if a user finds it convenient to place the main housing on his desk or workbench, the tester interface wall 18 will generally be vertical, whereas if he places the main housing on the floor beside his desk the wall 18 will generally be horizontal. Regardless of the orientation of the tester interface wall 18, it will generally be more convenient for the user if the engagement axis is vertical, so that the user can align the latches with the frame brackets by horizontal movement of the load board. The two orientations of the tester interface wall can be accommodated by pivoting the buffer unit, as described previously. However, it will be appreciated that use of the latches and frame brackets to hold the load board firmly perpendicular to the engagement axis while engaging the pin headers 128 with the receptacles 30 or disengaging the pin headers 128 from the receptacles 30, is not dependent on the ability to change the spatial orientation of the engagement axis relative to the tester interface wall, and FIG. 7 illustrates partially a personal tester without an auxiliary housing. In the case of FIG. 7, the two main boards are mounted in the housing 14 in a manner such that they can be displaced perpendicular to the tester interface wall 18. For example, the mechanism by which the main boards are mounted in the main housing 14 may be similar to the manner in which the buffer boards 120 are mounted in the buffer unit 46. It will be appreciated that in this case the load board 28 is attached directly to the tester interface wall 18 by engagement of the latches 152 with the frame brackets 148'.

In the case of the embodiment described with reference to FIGS. 1–6, the main housing 14 contains two tester main boards and correspondingly the buffer unit of the auxiliary housing contains two buffer boards. Two main boards and two buffer boards support use of two pairs of pin headers at the main tester interface and auxiliary tester interface and a test board having two pairs of receptacles 30. In a modification of the embodiment described with reference to FIGS. 1–6, the main housing contains only one main board and the buffer unit contains only one buffer board, and there is only one pair of pin headers at the main tester interface and auxiliary tester interface. In this case, there would be only one pair of receptacles on the test board. However, it will be appreciated that the invention is not restricted to there being one pair of pin headers at the main tester interface for each tester main board and one pair of pin headers at the auxiliary tester interface for each buffer board, and that such matters as the number of main boards and the relationship between the number of main boards and the number of pin headers may be dictated at least in part by availability of suitable components.

In another modification, there is no carrier board and the DUT side pin headers are mounted directly to the upper edge of the buffer board without an intervening tester side pin header and receptacle.

In a further modification, movement of the buffer boards may be brought about by a manual mechanism, e.g. a handwheel.

Although the invention has been described with reference to the test board being a load board, the invention is not restricted to the test board being a load board since it may be necessary or desirable to engage other boards, such as calibration boards, with the tester interface.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A semiconductor integrated circuit tester including:
   a housing having a tester interface area,
   a guide structure in the housing and defining an engagement axis that intersects the tester interface area,
   a circuit board structure fitted in the guide structure in a manner allowing movement of the circuit board structure relative to the housing along the engagement axis, the circuit board structure having a tester interface that is exposed exteriorly of the housing at the tester interface area,
   a drive means for urging the circuit board structure to move relative to the housing along the engagement axis, and an attachment mechanism for releasably engaging a test board having a test board interface and securing the test board against movement along the engagement axis in a direction away from the tester interface area, whereby, when the test board is secured to the housing by the attachment mechanism and the tester interface is not engaged with the test board interface, the drive means may be operated to urge the circuit board structure to move along the engagement axis in said direction to force the tester interface into engagement with the test board interface.

2. A tester according to claim 1, wherein the circuit board structure includes a circuit board disposed substantially parallel to the engagement axis and a carrier board disposed substantially perpendicular to the engagement axis, and the tester interface includes at least one connector member attached to the carrier board for engaging a complementary connector member of the test board interface.

3. A tester according to claim 1, wherein the circuit board structure includes a slide bracket that is attached to the tester housing, and a circuit board attached to the slide bracket in a manner allowing movement of the circuit board relative to the slide bracket along the engagement axis, and the tester interface includes a connector member attached to the circuit board for engaging a complementary connector member of the test board interface.

4. A tester according to claim 3, including a carrier plate attached to the slide bracket in a manner allowing movement of the carrier plate relative to the slide bracket along the engagement axis, and wherein the circuit board is attached to the carrier plate for movement therewith.

5. A tester according to claim 1, wherein the drive means includes a motor having a rotary output shaft and a transmission means connecting the rotary output shaft to the circuit board structure and converting rotation of the rotary output shaft to linear movement of the circuit board structure.

6. A tester according to claim 1, wherein said housing is an auxiliary tester housing and the tester also includes a main tester housing to which the auxiliary tester housing is attached, and wherein the main tester housing contains a circuit board that implements tester circuits and the circuit board structure implements buffer circuits for connecting the tester circuits to pins of the tester interface.

7. A tester according to claim 1, wherein the attachment mechanism comprises a plurality of attachment elements attached to the tester housing and wherein the attachment mechanism includes a positioning structure that allows the test board to be attached to the tester housing only in one relative position.

8. A semiconductor integrated circuit tester including:

a housing having a tester interface area, a guide structure in the housing and defining an engagement axis that intersects the tester interface area, a circuit board structure fitted in the guide structure in a manner allowing movement of the circuit board structure relative to the housing along the engagement axis, the circuit board structure having a tester interface that is exposed exteriorly of the housing at the tester interface area, a drive means for urging the circuit board structure to move relative to the housing along the engagement axis, a test board having a test board interface for engaging the tester interface, and an attachment mechanism for releasably engaging the test board and securing the test board against movement along the engagement axis in a direction away from the tester interface area, the attachment mechanism including first and second complementary attachment elements secured to the tester housing and the test board respectively, whereby, when the test board is secured to the housing by the attachment mechanism and the tester interface is not engaged with the test board interface, the drive means may be operated to urge the circuit board structure to move along the engagement axis in said direction to force the tester interface into engagement with the test board interface.

9. A tester according to claim 8, wherein the attachment mechanism comprises a plurality of first attachment elements secured to the tester housing and a plurality of second attachment elements secured to the test board, and wherein the attachment mechanism includes a positioning structure that prevents engagement of the test board with the tester housing unless the test board is in a single predetermined rotational position relative to the tester housing about the engagement axis.

* * * * *